United States Patent [19]
Sato

[11] Patent Number: 6,105,783
[45] Date of Patent: Aug. 22, 2000

[54] EMBOSSED CARRIER TAPE AND EMBOSSED CARRIER TAPING METHOD

[75] Inventor: Katsuaki Sato, Miyagi, Japan

[73] Assignee: Oki Electric Industry Co., Ltd., Tokyo, Japan

[21] Appl. No.: 09/280,861

[22] Filed: Mar. 30, 1999

[30] Foreign Application Priority Data

Jan. 13, 1999 [JP] Japan .................................. 11-006713

[51] Int. Cl.[7] .................................................. B65D 73/02
[52] U.S. Cl. .......................................... 206/714; 206/585
[58] Field of Search .................................. 206/713, 714, 206/585; 53/452, 453, 456

[56] References Cited

U.S. PATENT DOCUMENTS 5,033,615  7/1991  Shima et al. ............................. 206/714
5,234,104  8/1993  Schulte et al. .......................... 206/714

FOREIGN PATENT DOCUMENTS

H08-198318  1/1995  Japan .

*Primary Examiner*—Jacob K. Ackun
*Attorney, Agent, or Firm*—Rabin & Champagne, PC

[57] ABSTRACT

In order to solve the aforementioned problems, the present invention provides an embossed carrier tape comprising a plurality of device holes defined in an embossed carrier tape material at predetermined intervals so as to hold electronic devices therein, and protective ribs provided between the adjacent device holes respectively. Another invention provides a taping method for an embossed carrier tape with electronic devices held therein, comprising the following steps of accommodating the electronic devices in a plurality of device holes defined in the embossed carrier tape respectively, and winding the embossed carrier tape around a tape reel with predetermined spaces respectively defined between lower surfaces of the overlapping one device holes and upper surfaces of the overlapping other device holes upon successively winding the same therearound.

13 Claims, 2 Drawing Sheets

EMBOSSED CARRIER TAPE AND EMBOSSED CARRIER TAPING METHOD

BACKGROUND OF THE INVENTION

1. Field of the Invention

This invention relates to an embossed carrier tape and an embossed carrier taping method, and particularly to a structure for protecting an embossed carrier tape used for holding and packaging small-sized electronic devices such as a semiconductor device, a capacitor, a resistor, etc. and an embossed carrier taping method.

2. Description of the Related Art

An embossed carrier tape is generally used to hold and package small-sized electronic devices such as a semiconductor device, a capacitor, a resistor, etc. The embossed carrier tape having the small-sized electronic devices held and packaged therein is subjected to taping so as to fall into a state of being successively wound around a tape reel to facilitate storage and transportation thereof. With advances in thinning of a package for electronic devices, the treatment thereof requires circumspection increasingly in recent years.

However, a conventional embossed carrier tape structure has a possibility that when an embossed carrier tape is wound around a tape reel in roll form, the lower surface of one device hole is brought into contact with the upper surface of the other device hole, whereby the device holes will cause deformation such as crushing or the like. The deformation of the device holes raises the possibility of causing inconvenience such as breakage and deformation of the electronic devices held in the device holes, bends in lead or an inability to take out the electronic devices from the device holes upon their unpackaging in a subsequent process, etc. Such inconvenience shows a tendency to become increasingly pronounced as the electronic devices become thin.

SUMMARY OF THE INVENTION

With the foregoing in view, it is therefore an object of the present invention to provide an embossed carrier tape structure and an embossed carrier taping method wherein when an embossed carrier tape with electronic devices held and packaged therein is wound around a tape reel, deformation and breakage of the electronic devices, bends in lead, etc. can be prevented beforehand.

It is another object of the present invention to provide an embossed carrier tape structure and an embossed carrier taping method wherein electronic devices can be easily taken out from device holes respectively upon their unpacking in a subsequent process.

According to one aspect of the invention, for achieving the above objects, there is provided an embossed carrier tape comprising a plurality of device holes defined in an embossed carrier tape material at predetermined intervals so as to hold electronic devices therein, and protective ribs provided between the adjacent device holes respectively.

According to another aspect of the invention, there is provided a taping method for an embossed carrier tape with electronic devices held thereon, comprising the following steps of accommodating the electronic devices in a plurality of device holes defined in the embossed carrier tape respectively, and winding the embossed carrier tape around a tape reel with predetermined spaces respectively defined between the lower surfaces of the overlapping one device holes and the upper surfaces of the overlapping other device holes upon successively winding the same therearound.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects, features of the invention and further objects, features and advantages thereof will be better understood from the following description taken in connection with the accompanying drawings in which:

DESCRIPTION OF THE PREFERRED EMBODIMENTS

Preferred embodiments of the present invention will hereinafter be described in detail with reference to the accompanying drawings.

[First Embodiment]

Figure 1:
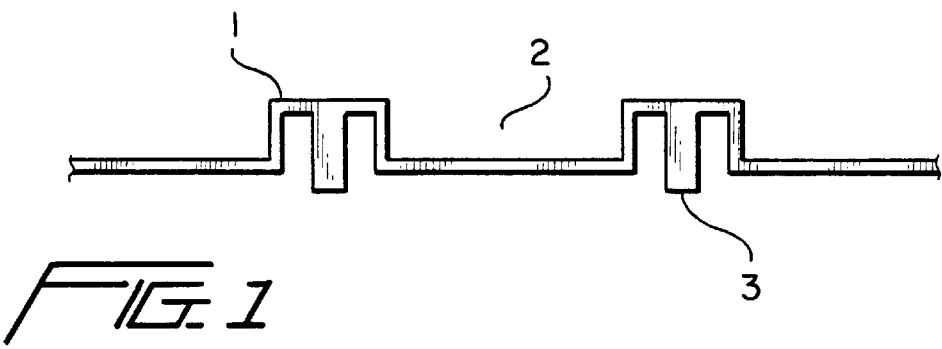
FIG. 1 is an explanatory view showing a first embodiment of the present invention.

FIG. 1 is an explanatory view showing a first embodiment of the present invention. An embossed carrier tape 1 is provided with device holes 2 at predetermined intervals. Small-sized electronic devices such as a semiconductor device, a capacitor, a resistor, etc. are held in each device hole 2. Each of protective ribs 3 is provided between the adjacent device holes 2. The protective rib 3 has a structure whose length is longer than the depth of each device hole 2. Described more specifically, the protective rib 3 is formed with such a structure that the length thereof extending in the direction of the depth of each device hole 2 is longer than the depth of the device hole 2. The protective ribs 3 described in the present embodiment are identical in material to the embossed carrier tape 1 and molded integrally with the embossed carrier tape 1.

Figure 2:
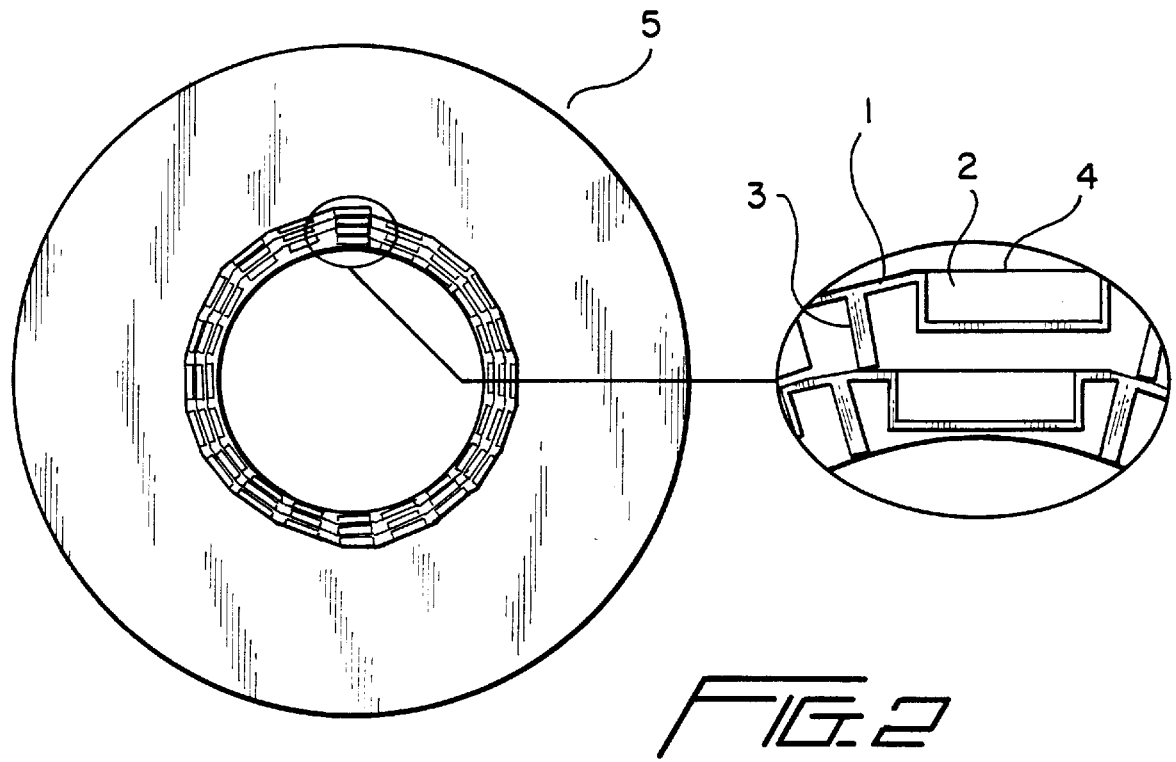
FIG. 2 is an explanatory view illustrating embossed carrier taping employed in the first embodiment of the present invention.

A description will next be made of an embossed carrier taping method of accommodating the electronic devices in the device holes respectively and thereafter successively winding a package-completed or packed embossed carrier tape round a tape reel. FIG. 2 is an explanatory view showing a state in which the embossed carrier tape is wound around the tape reel. First, electronic devices are inserted into each device hole 2 of the embossed carrier tape 1. Next, the embossed carrier tape 1 is covered with a cover tape 4 from the side above the device holes 2 and then subjected to thermocompression bonding or the like, whereby the packaging of the embossed carrier tape 1 is completed.

Thereafter, the embossed carrier tape with the electronic devices held therein is successively wound around a tape reel 5. At this time, the embossed carrier tape is wound therearound in a state in which the respective device holes are respectively being suspended from overlapping other device holes by the protective ribs 3 provided between the adjacent device holes. This state is illustrated in an enlarged drawing of an internal portion of an ellipse indicated by the dotted lines in FIG. 2. Such an embossed carrier taping method can be implemented owing to such a structure that the length of each protective rib 3 extending in the direction of the depth of the device hole 2 is longer than the depth of the device hole 2. As a result, the overlapping device holes no interfere with each other therebetween.

According to the first embodiment of the present invention as described above, since the device holes do not interfere with each other therebetween and are not deformed, there is no apprehension as to breakage and deformation of the electronic devices held in each device hole, bends in lead, etc. There is no inconvenience such as an inability to take out the electronic devices from each device hole upon their unpacking in the subsequent process.

Incidentally, the present embodiment has described the protective ribs identical to the embossed carrier tape 1 in material and molded integrally with the embossed carrier tape 1 as an illustrative example. However, even if the protective ribs comprised of another material are additionally attached to the embossed carrier tape 1, the same effect as described above can be obtained.

[Second embodiment]

Figure 3:
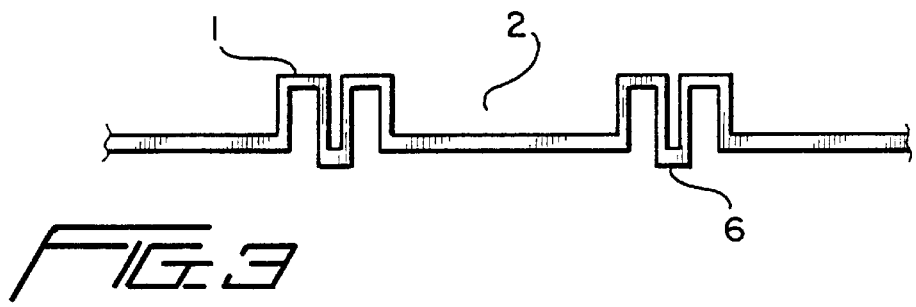
FIG. 3 is an explanatory view depicting a second embodiment of the present invention.

FIG. 3 is an explanatory view showing a second embodiment of the present invention. The second embodiment is different from the first embodiment in that concave portions 6 are respectively provided between adjacent device holes 2 in place of the protective ribs 3. Since other elements of structure of an embossed carrier tape 1 are identical to those employed in the first embodiment, they are identified by the same reference numerals and the description of certain common elements will therefore be omitted. The concave portions 6 described in the present embodiment are identical in material to the embossed carrier tape 1 and molded integrally with the embossed carrier tape 1.

Figure 4:
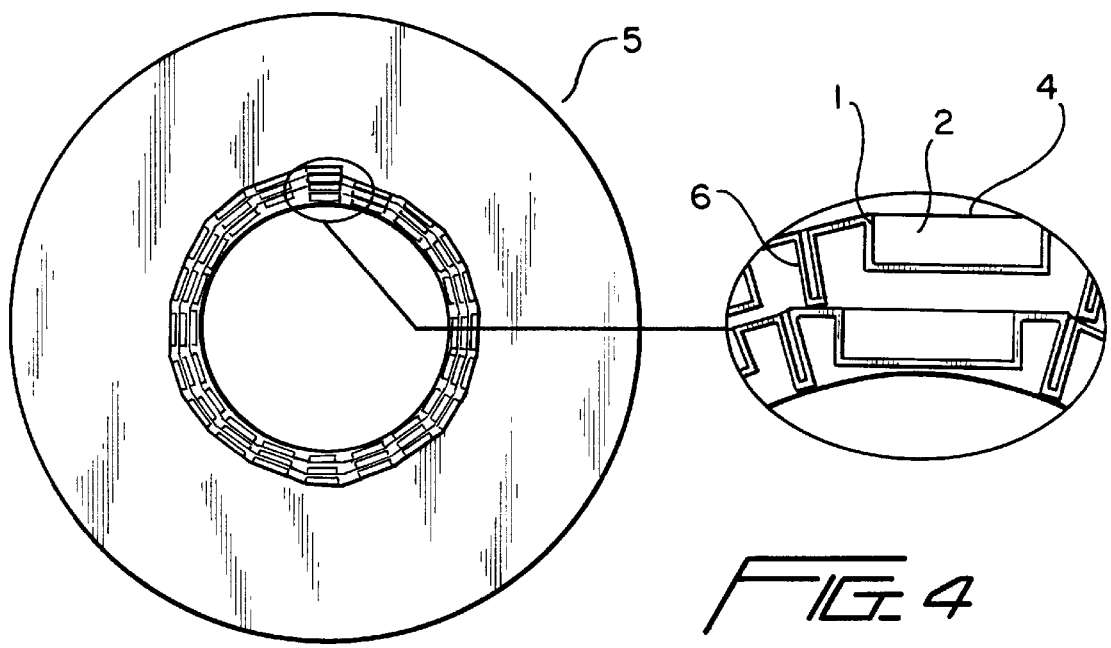
FIG. 4 is an explanatory view showing embossed carrier taping employed in the second embodiment of the present invention.

A description will next be made of an embossed carrier taping method of successively winding a packaged embossed carrier tape around a tape reel. FIG. 4 is an explanatory view showing a state in which the embossed carrier tape is wound around the tape reel. First, electronic devices are inserted into each device hole 2 of the embossed carrier tape 1. Next, the embossed carrier tape 1 is covered with a cover tape 4 from the side above the device holes 2 and then subjected to thermocompression bonding or the like, whereby the packaging of the embossed carrier tape 1 is completed. The process executed until now is identical to that of the first embodiment.

Thereafter, the embossed carrier tape with the electronic devices held therein is successively wound around a tape reel 5. At this time, the embossed carrier tape is wound therearound in a state in which the respective device holes are respectively being suspended from overlapping other device holes by the concave portions 6 provided between the adjacent device holes. This state is shown in an enlarged drawing of an internal portion of an ellipse indicated by the dotted lines in FIG. 4. Such an embossed carrier taping method can be realized owing to such a structure that the depth of each concave portion 6 becomes deeper than the depth of the device hole 2. As a result, the overlapping device holes no interfere with each other therebetween. Further, since the concave portions 6 employed in the present embodiment are flexible in structure in the direction of curvature of the tape reel 5, they exert their further effects when the tape reel 5 is small in diameter.

[Third Embodiment]

Figure 5:
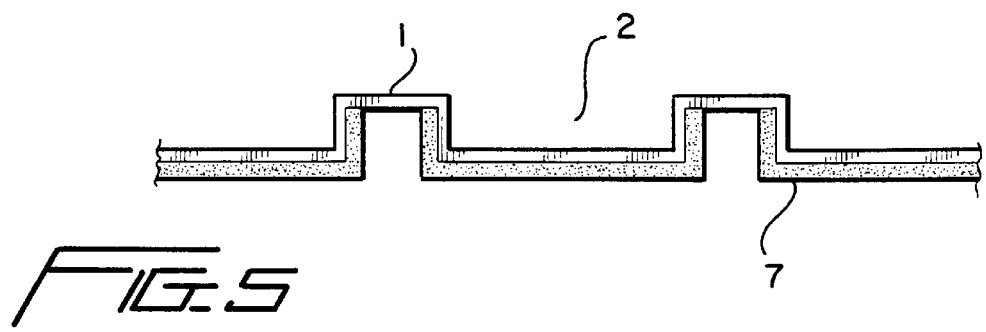
FIG. 5 is an explanatory view illustrating a third embodiment of the present invention.

FIG. 5 is an explanatory view showing a third embodiment of the present invention. In the third embodiment, protective cushioning materials 7 for protecting device holes 2 from an external shock are respectively mounted on or applied onto over the outer surfaces of the device holes 2. It is desirable that the protective cushioning materials 7 make use of a material having strength corresponding to the extent to which the device holes 2 are not deformed upon winding a packaged embossed carrier tape 1 around a tape reel 5. Even when the protective cushioning materials 7 are formed over the inner surfaces of the device holes 2 or the inner and outer surfaces thereof respectively, the device holes 2 can be protected from the external shock.

According to the embossed carrier tape and embossed carrier taping method of the present invention, as have been described above in detail, overlapping device holes do not interfere with each other therebetween when an embossed carrier tape with electronic devices held therein is wound around a tape reel. It is therefore possible to prevent deformation and breakage of the electronic devices, bends in lead, etc. beforehand.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. An embossed carrier tape, comprising:

a plurality of device holes defined in an embossed carrier tape material at predetermined intervals so as to hold electronic devices therein; and concave portions provided between said adjacent device holes and whose depths are deeper than the depth of said each device hole.

2. The embossed carrier tape according to claim 1, wherein said concave portions are molded integrally with said embossed carrier tape material.

3. An embossed carrier tape, comprising:

a plurality of device holes defined in an embossed carrier tape material at predetermined intervals so as to hold electronic devices therein; and protective ribs provided between the adjacent device holes respectively.

4. The embossed carrier tape according to claim 3, wherein said protective ribs are formed of the same material as that for said embossed carrier tape material.

5. The embossed carrier tape according to claim 4, wherein said protective ribs are molded integrally with said embossed carrier tape material.

6. The embossed carrier tape according to claim 3, wherein said protective ribs are formed so as to be longer than the depth of said each device hole.

7. An embossed carrier tape, comprising:

a plurality of device holes defined in an embossed carrier tape material at predetermined intervals so as to hold electronic devices therein; and protective cushioning materials provided on the outer surfaces of said device holes so as to protect said device holes from an external shock.

8. The embossed carrier tape according to claim 1, wherein said protective materials are respectively provided on the inner surfaces of said device holes.

9. The embossed carrier tape according to claim 1, wherein said protective materials are respectively provided on the inner and outer surfaces of said device holes.

10. An embossed carrier taping method, comprising the following steps of:

accommodating electronic devices in a plurality of device holes defined in an embossed carrier tape, respectively; and winding said embossed carrier tape around a tape reel with predetermined spaces respectively defined between lower surfaces of the overlapping one device holes and upper surfaces of the overlapping other device holes upon successively winding the same therearound.

11. The embossed carrier taping method according to claim 8, wherein said embossed carrier tape is successively wound around the tape reel in a state in which said device holes are respectively being suspended from the overlapping other device holes by protective ribs provided between adjacent device holes.

12. The embossed carrier taping method according to claim 8, wherein said embossed carrier tape is successively wound around the tape reel in a state in which said device holes are respectively being suspended from the overlapping other device holes by concave portions provided between said adjacent device holes.

13. The embossed carrier tape according to claim 1, wherein said protective ribs are molded integrally with said embossed carrier tape material.

* * * * *